(12) United States Patent
Kim et al.

(10) Patent No.: US 9,142,715 B2
(45) Date of Patent: Sep. 22, 2015

(54) LIGHT EMITTING DIODE

(75) Inventors: Chang Youn Kim, Ansan-si (KR); Joon Hee Lee, Ansan-si (KR); Jong Kyun You, Ansan-si (KR); Hong Chol Lim, Ansan-si (KR); Hwa Mok Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 485 days.

(21) Appl. No.: 13/099,127

(22) Filed: May 2, 2011

(65) Prior Publication Data

US 2011/0316026 A1    Dec. 29, 2011

(30) Foreign Application Priority Data

Jun. 24, 2010  (KR) .................. 10-2010-0059861
Jul. 28, 2010  (KR) .................. 10-2010-0072821

(51) Int. Cl.
*H01L 33/00* (2010.01)
*H01L 33/10* (2010.01)
*H01L 33/02* (2010.01)

(52) U.S. Cl.
CPC .............. *H01L 33/10* (2013.01); *H01L 33/025* (2013.01); *H01L 2933/0091* (2013.01)

(58) Field of Classification Search
CPC ................................ H01L 33/10; H01L 33/46
USPC .................................................. 257/98–100
See application file for complete search history.

(56) References Cited

U.S. PATENT DOCUMENTS

| | | | |
|---|---|---|---|
| 5,779,924 A * | 7/1998 | Krames et al. ................ 216/24 |
| 6,040,590 A | 3/2000 | Obrien et al. | |
| 6,552,369 B2 | 4/2003 | Chiou et al. | |
| 6,744,071 B2 * | 6/2004 | Sano et al. ................... 257/79 |
| 7,622,746 B1 | 11/2009 | Lester et al. | |
| 7,704,763 B2 | 4/2010 | Fujii et al. | |
| 7,768,023 B2 * | 8/2010 | Diana et al. ................ 257/98 |
| 7,804,104 B2 | 9/2010 | Lin et al. | |
| 8,373,188 B2 | 2/2013 | Suh et al. | |

(Continued)

FOREIGN PATENT DOCUMENTS

| | | |
|---|---|---|
| CN | 1652363 | 8/2005 |
| CN | 1996627 | 7/2007 |

(Continued)

OTHER PUBLICATIONS

PCT International Search Report dated Dec. 20, 2011 for International Application No. PCT/KR2011/003269.

(Continued)

*Primary Examiner* — Samuel Gebremariam
(74) *Attorney, Agent, or Firm* — H.C. Park & Associates, PLC (57) ABSTRACT

An exemplary embodiment of the present invention relates to a light emitting diode (LED) including a substrate, a first nitride semiconductor layer arranged on the substrate, an active layer arranged on the first nitride semiconductor layer, a second nitride semiconductor layer arranged on the active layer, a third nitride semiconductor layer disposed between the first nitride semiconductor layer or between the second nitride semiconductor layer and the active layer, the third nitride semiconductor layer comprising a plurality of scatter elements within the third nitride semiconductor layer, and a distributed Bragg reflector (DBR) comprising a multi-layered structure, the substrate being arranged between the DBR and the third nitride semiconductor layer.

17 Claims, 7 Drawing Sheets

(56) References Cited

U.S. PATENT DOCUMENTS

| | | | |
|---|---|---|---|
| 8,426,872 B2* | 4/2013 | Erchak et al. | 257/79 |
| 2002/0024055 A1 | 2/2002 | Uemura et al. | |
| 2002/0055218 A1 | 5/2002 | Chiou et al. | |
| 2005/0104078 A1 | 5/2005 | Cheng et al. | |
| 2007/0187698 A1* | 8/2007 | Lee et al. | 257/79 |
| 2008/0087909 A1* | 4/2008 | Weisbuch et al. | 257/98 |
| 2008/0303047 A1 | 12/2008 | Shen et al. | |
| 2008/0303052 A1 | 12/2008 | Lee et al. | |
| 2009/0032830 A1 | 2/2009 | Li | |
| 2009/0057702 A1 | 3/2009 | Chiu | |
| 2009/0114935 A1 | 5/2009 | Huang et al. | |
| 2009/0283783 A1* | 11/2009 | Streubel | 257/98 |
| 2010/0001258 A1 | 1/2010 | Shimizu et al. | |
| 2010/0148199 A1 | 6/2010 | Kim et al. | |
| 2010/0225226 A1 | 9/2010 | Murazaki et al. | |
| 2011/0114969 A1 | 5/2011 | Lee et al. | |
| 2011/0127549 A1 | 6/2011 | Lee et al. | |
| 2011/0164308 A1 | 7/2011 | Arsenault et al. | |
| 2012/0025244 A1 | 2/2012 | Suh et al. | |
| 2012/0126203 A1 | 5/2012 | Knapp | |

FOREIGN PATENT DOCUMENTS

| | | | |
|---|---|---|---|
| CN | 101015071 | 8/2007 | |
| CN | 101197417 | 6/2008 | |
| CN | 101438423 | 5/2009 | |
| EP | 1667241 | 6/2006 | |
| EP | 1 521 313 | 12/2010 | |
| JP | 07-254732 | 10/1995 | |
| JP | 11-126925 | 5/1999 | |
| JP | 2001-156327 | 6/2001 | |
| JP | 2003-124576 | 4/2003 | |
| JP | 2003-528421 | 9/2003 | |
| JP | 2005-109113 | 4/2005 | |
| JP | 2006-108673 | 4/2006 | |
| JP | 2006-351808 | 12/2006 | |
| JP | 2007-505479 | 3/2007 | |
| JP | 2008-117922 | 5/2008 | |
| JP | 2008-130663 | 6/2008 | |
| JP | 2008-527626 | 7/2008 | |
| JP | 2008-536294 | 9/2008 | |
| JP | 2010-021546 | 1/2010 | |
| JP | 2010-135798 | 6/2010 | |
| KR | 10-2005-0014343 | 2/2005 | |
| KR | 10-2005-0079279 | 8/2005 | |
| KR | 10-2005-0096010 | 10/2005 | |
| KR | 10-2006-0059783 | 6/2006 | |
| KR | 100679235 | 1/2007 | |
| KR | 10-2007-0072826 | 7/2007 | |
| KR | 10-2008-0017180 | 2/2008 | |
| KR | 1020080061694 | 7/2008 | |
| KR | 10-2009-0039932 | 4/2009 | |
| KR | 10-0902894 | 6/2009 | |
| KR | 10-2009-0103472 | 10/2009 | |
| KR | 10-2010-0035846 | 4/2010 | |
| WO | 00/76010 | 12/2000 | |
| WO | 2005/024960 | 3/2005 | |
| WO | 2006/059828 | 6/2006 | |
| WO | 2006/083413 | 8/2006 | |
| WO | 2006/093937 | 9/2006 | |
| WO | 2008/082097 | 7/2008 | |
| WO | WO2008082097 | * 7/2008 | H01L 33/00 |
| WO | 2011/016820 | 2/2011 | |

OTHER PUBLICATIONS

Preliminary Notice of First Office Action issued on Jun. 19, 2013 in Taiwanese Patent Application No. 099127122.

Non-Final Office Action issued on Jun. 6, 2013 in U.S. Appl. No. 12/917,937.

Non-Final Office Action issued on Jun. 17, 2013 in U.S. Appl. No. 13/760,637.

Y.S. Zhao, et al. "Efficiency Enhancement of InGaN/GaN Light-Emitting Diodes with a Back-Surface Distributed Bragg Reflector", Journal of Electronic Materials, vol. 32, No. 12, Aug. 13, 2003.

Non-Final Office Action issued on Jun. 15, 2012 in U.S. Appl. No. 13/100,879.

Notice of Allowance issued on Nov. 27, 2012 in U.S. Appl. No. 13/100,879.

Non-Final Office Action issued on Apr. 5, 2013 in U.S. Appl. No. 13/023,876.

Notice of Allowance issued on Aug. 27, 2013 in U.S. Appl. No. 13/023,876.

Non-Final Office Action issued on Dec. 10, 2013 in U.S. Appl. No. 13/760,637.

Partial European Search Report issued in European Application No. 10177001.4, dated Nov. 8, 2013.

OSRAM Opto Semico, JP, Sep. 24, 2003, Seiko Epson Corp. and Cambridge Display Tech.

Notice of Allowance issued Sep. 15, 2014, in U.S. Appl. No. 12/917,937.

Extended European Search Report issued on Feb. 25, 2014 in European Patent Application No. 10177001.4.

Alfred Thelen, "Design of Optical Interference Coatings", McGraw-Hill Book Company, Jan. 1, 1989, pp. 1-223, Hanau, Germany.

Notice of Allowance issued on Aug. 11, 2014 in U.S. Appl. No. 13/760,637.

Final Office Action issued on Jul. 18, 2014 in U.S. Appl. No. 13/760,637.

Non-Final Office Action dated Apr. 11, 2014 in U.S. Appl. No. 12/917,937.

Chih-Chien Lin, et al., "GaN-Based Resonant-Cavity Light-Emitting Diodes With Top and Bottom Dielectric Distributed Bragg Reflectors", IEEE, Sep. 1, 2010, pp. 1291-1293, vol. 22, No. 17.

Y. Higuchi, et al., "Room-Temperature CW Lasing of a GaN-Based Vertical-Cavity Surface-Emitting Laser by Current Injection", Applied Physics Express 1, 2008, pp. 121102-1-121102-3.

S. J. Chang, et al., "Nitride-Based LEDs With a Hybrid Al Mirror+Tio2/Sio2 DBR Backside Reflector", Journal of Lightwave Technology, Sep. 1, 2008, pp. 3131-3136, vol. 26, No. 17.

Chinese Office Action issued on Dec. 22, 2014, in Chinese Application No. 201180037028.7.

Chinese Office Action issued Apr. 21, 2015, in corresponding Chinese Application No. 201180005026.X.

* cited by examiner

LIGHT EMITTING DIODE

CROSS-REFERENCE TO RELATED APPLICATIONS

This application claims priority from and the benefit of Korean Patent Application No. 10-2010-0059861, filed on Jun. 24, 2010 and Korean Patent Application No. 10-2010-0072821, filed on Jul. 28, 2010, which are hereby incorporated by reference for all purposes as if fully set forth herein.

BACKGROUND OF THE INVENTION

1. Field of the Invention

Exemplary embodiments of the present invention relate to a light emitting diode (LED), and more particularly, to an LED having improved light extraction efficiency.

2. Description of the Related Art

Gallium nitride (GaN)-based LEDs are widely used for display elements and backlights. Further, LEDs may have lower electric power consumption and a longer lifetime as compared with conventional light bulbs or fluorescent lamps, so that their applications have been expanded into general illumination while substituting for conventional incandescent bulbs and fluorescent lamps. Particularly, various types of LED packages, which emit mixed-color light, e.g., white light, have been introduced into the marketplace. A white light LED package may be used in backlight units, for general illumination, or the like.

Since the luminous efficiency of an LED package may depend on the luminous efficiency of an LED, efforts have been continuously made for improving the luminous efficiency of the LED. Particularly, efforts have been made for improving the light extraction efficiency of the LED.

In general, GaN-based nitride semiconductors may be grown on a heterogeneous substrate such as sapphire or silicon carbide. Particularly, nitride semiconductor layers may be formed on a patterned sapphire substrate (PSS), and the PSS may generally be used to fabricate an LED using the nitride semiconductor layers. The PSS may improve light extraction efficiency by scattering the light emitted from an active layer toward the substrate. Further, luminous efficiency may be improved by forming a metal reflector on a bottom surface of a transparent substrate such as a sapphire substrate to reflect light that passes through the sapphire substrate.

However, until the light generated in the active layer is scattered on a surface of the sapphire substrate, the light may proceed for a considerable distance within the nitride semiconductor layers. Even after the light is scattered on the surface of the sapphire substrate, the light may also proceed to a light emission surface for a considerable distance. Accordingly, since a light path may be lengthened, light loss may occur, and a portion of the scattered light may be trapped in the nitride semiconductor layers by internal total reflection.

A reflection metal layer, which may be made of aluminum, formed on the bottom surface of the sapphire substrate, may exhibit a reflectance of about 80% throughout the almost entire wavelength region of visible light. This reflectance is relatively high, but light loss may still occur even when the reflection metal layer is formed.

Meanwhile, sapphire is an electrical insulator, which accordingly limits the structure of an LED to a lateral type. Accordingly, there has recently been developed a technique in which epitaxial layers, such as nitride semiconductor layers, are grown on a heterogeneous substrate such as a sapphire substrate, a support substrate is bonded to the epitaxial layers, and the heterogeneous substrate is then separated using a laser lift-off technique or the like, thereby fabricating a high-efficiency vertical type LED (e.g., see U.S. Pat. No. 7,704,763, issued to Fujii, et al.).

Figure 1:
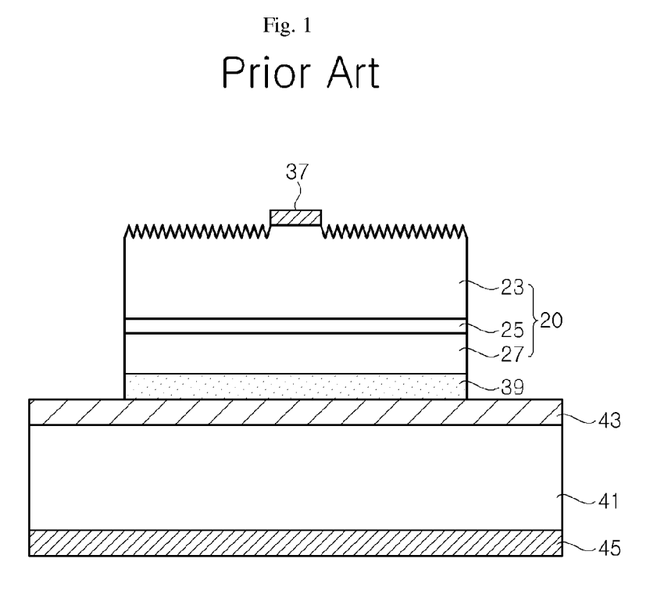
FIG. 1 is a cross-sectional view illustrating a conventional vertical type LED.

FIG. 1 is a sectional view illustrating a conventional LED.

Referring to FIG. 1, a conventional vertical-type LED is fabricated by sequentially forming a GaN-based n-type layer 23, a GaN-based active layer 25 and a GaN-based p-type layer 27 on a growth substrate (not shown), forming a p-electrode 39 on the p-type layer 27, flip-bonding the p-electrode 39 to a Si submount 41 using a bonding metal 43, removing the growth substrate, and then forming an n-electrode 37 on the exposed n-type layer 23. An n-electrode 45 is then formed on the bottom surface of the Si submount 41. Furthermore, in U.S. Pat. No. 7,704,763, the surface of the exposed n-type layer 23 is formed to be roughened using a dry or photo-enhanced chemical (PEC) etching technique.

SUMMARY OF THE INVENTION

Exemplary embodiments of the present invention provide an LED having improved light extraction efficiency.

Exemplary embodiments of the present invention also provide an LED having improved luminous efficiency by improving light reflectance.

Exemplary embodiments of the present invention also provide an LED having a reflector that exhibits high reflectance throughout the whole wavelength region of visible light.

Additional features of the invention will be set forth in the description which follows, and in part will be apparent from the description, or may be learned by practice of the invention.

An exemplary embodiment of the present invention discloses an LED including a substrate, a first nitride semiconductor layer arranged on the substrate, an active layer arranged on the first nitride semiconductor layer, a second nitride semiconductor layer arranged on the active layer, a third nitride semiconductor layer disposed between the first nitride semiconductor layer and the active layer or between the second nitride semiconductor layer and the active layer, the third nitride semiconductor layer having a plurality of scatter elements within the third nitride semiconductor layer, and a distributed Bragg reflector (DBR) having a multi-layered structure, the substrate being arranged between the DBR and the third nitride semiconductor layer.

An exemplary embodiment of the present invention discloses an LED including a semiconductor stack arranged on a support substrate, a first electrode arranged between the support substrate and the semiconductor stack, the first electrode being in ohmic contact with the semiconductor stack, the first electrode having a region exposed to the outside of the semiconductor stack, a first bonding pad arranged on the first region of the first electrode, the first bonding electrically connected to the first electrode, and a second electrode arranged on the semiconductor stack. At least one of the first conductivity-type semiconductor layer and the second conductivity-type semiconductor layer includes a plurality of scatter elements spaced apart from one another. The semiconductor stack includes a p-type compound semiconductor layer, an active layer, and an n-type compound semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
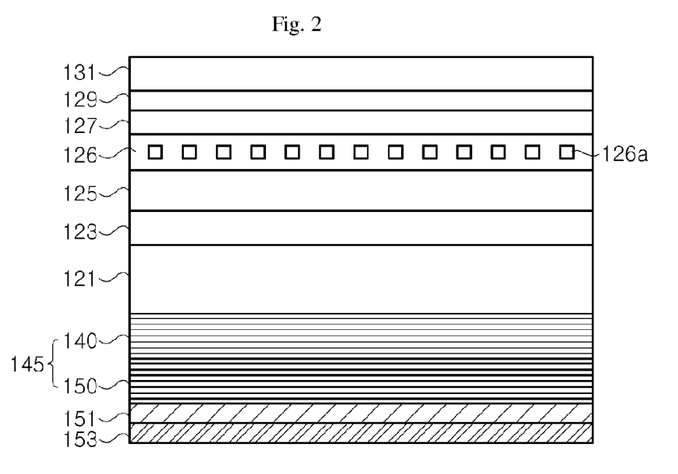
FIG. 2 is a cross-sectional view illustrating an LED according to an exemplary embodiment of the present invention.
Figure 3A:
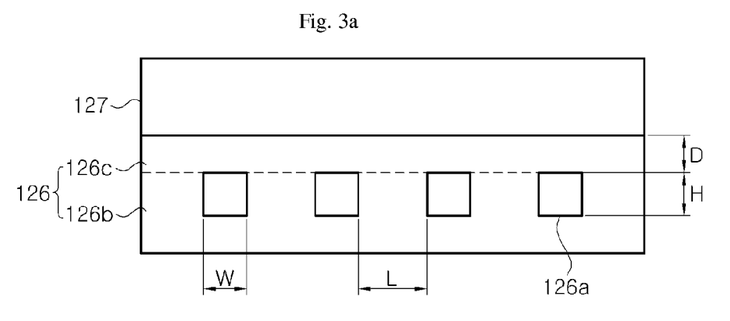
FIG. 3a is an enlarged partial sectional view of a portion of the LED shown in FIG. 2, for illustrating the LED according to the exemplary embodiment of the present invention.

FIG. 2 is a sectional view illustrating an LED according to an exemplary embodiment of the present invention. FIG. 3a is an enlarged partial sectional view of a portion of FIG. 2.

Referring to FIG. 2, the LED comprises a substrate 121, a first nitride semiconductor layer 125, an active layer 127, a second nitride semiconductor layer 131, a third nitride semiconductor layer 126 and a DBR 145 with a multi-layered structure. The third nitride semiconductor layer 126 includes scatter elements 126a. The LED may further comprise a buffer layer 123, a clad layer 129, a reflection metal layer 151 and a protection metal layer 153.

The substrate 121 is not particularly limited as long as it is a transparent substrate. For example, the substrate may be a sapphire or SiC substrate. Like a patterned sapphire substrate (PSS), the substrate 121 may also have a predetermined pattern on a top surface thereof. Meanwhile, the area of the substrate 121 determines the entire area of an LED chip. In exemplary embodiments of the present invention, as the area of the LED is relatively increased, the scattering and reflecting effects increase. In some cases, the area of the substrate 121 may be 90,000 $\mu m^2$ or more. In other cases, the area of the substrate 121 may be 1 $mm^2$ or more.

Positioned on top of the substrate 121 are the first nitride semiconductor layer 125, the third nitride semiconductor layer 126, the active layer 127, the clad layer 129 and the second nitride semiconductor layer 131. The active layer 127 is positioned between the first and second nitride semiconductor layers 125 and 131. In the present exemplary embodiment, the first nitride semiconductor layer 125 and the second nitride semiconductor layer 131 have conductivity types opposite to each other, respectively. For example, the conductivity types thereof may be an n-type and a p-type, respectively, and vice versa.

The first nitride semiconductor layer 125, the active layer 127, the clad layer 129 and the second nitride semiconductor layer 131 may be formed of a GaN-based compound semiconductor material, i.e., an (Al, In, Ga)N. The composition elements and the composition ratio of the active layer 127 are determined so as to emit light of a desired wavelength, e.g., ultraviolet light or blue light. Although the first nitride semiconductor layer 125 and/or the second nitride semiconductor layer 131 may be formed to have a single-layered structure as shown in the figures, they are not limited thereto, but may be formed to have a multi-layered structure. The first nitride semiconductor layer 125 and the second nitride semiconductor layer 131 may be n-type and p-type contact layers, respectively. In addition, the active layer 127 may be formed to have a single or multiple quantum well structure. The buffer layer 123 may be interposed between the substrate 121 and the first nitride semiconductor layer 125.

Figure 3B:
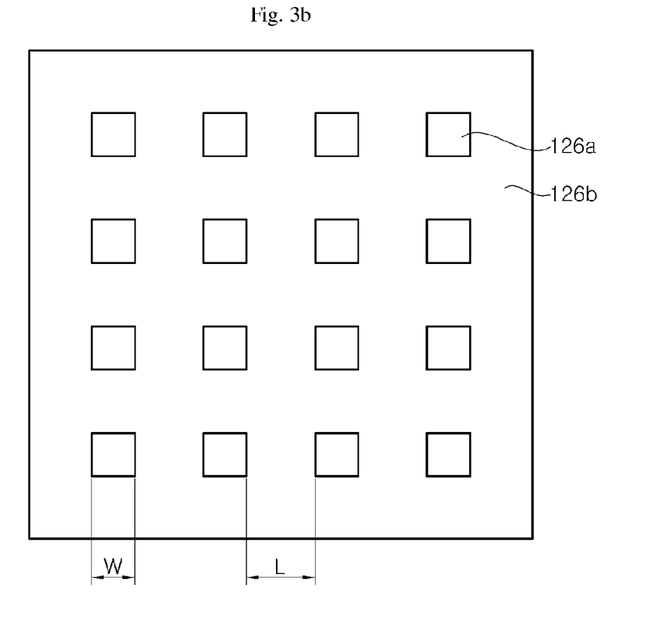
FIG. 3b is a top view of the LED shown in FIG. 2 according to an exemplary embodiment of the present invention, illustrating scatter elements having an island shape.
Figure 3C:
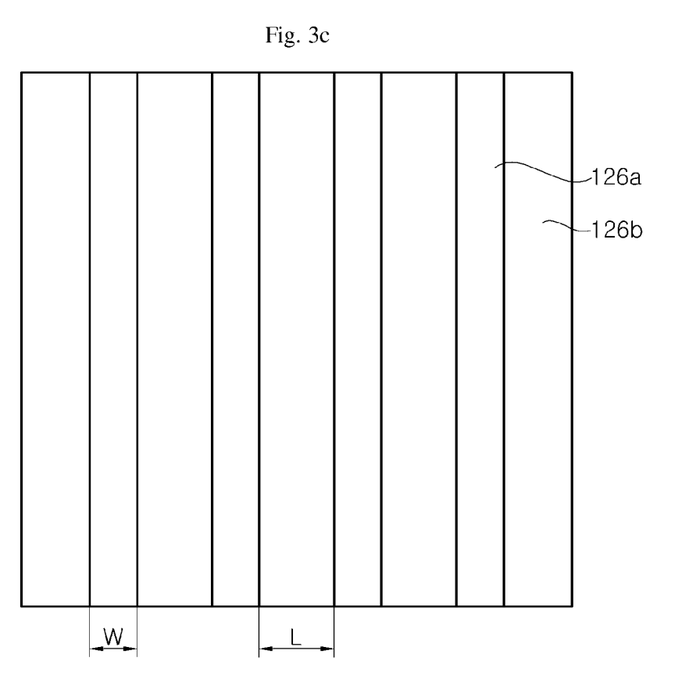
FIG. 3c is a top of view of the LED shown in FIG. 2 according to an exemplary embodiment of the present invention, illustrating scatter elements having a stripe shape.
Figure 3D:
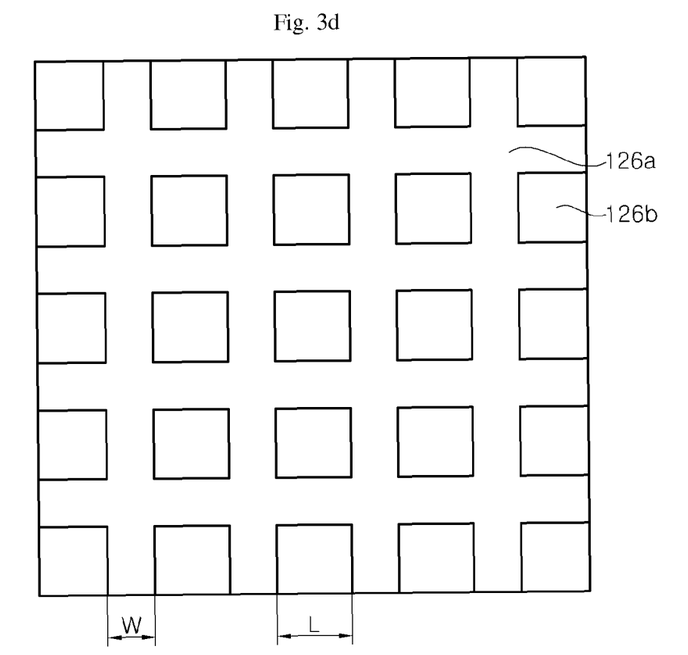
FIG. 3d is a top view of the LED shown in FIG. 2 according to an exemplary embodiment of the present invention, illustrating scatter elements having a mesh shape.

Meanwhile, the third nitride semiconductor layer 126 is positioned between the first nitride semiconductor layer 125 and the active layer 127, and has the scatter elements 126a formed in the inside thereof. The scatter elements 126a may be formed by an insulation layer of silicon oxide or silicon nitride and then patterning the insulation layer using a photolithography and etching technique. The third semiconductor layer 126 can be grown using a method such as an epitaxial lateral overgrowth (ELOG) method, after the scatter elements 126a are formed on the semiconductor layer 125 or a part of the third semiconductor layer 126. Alternatively, as shown in FIG. 3a, the scatter elements 126a, e.g. air gaps, may be formed by growing a lower nitride semiconductor layer 126b, patterning the lower nitride semiconductor layer 126b using a photolithography and etching technique, such as a nano-imprinting technique, and then re-growing an upper nitride semiconductor layer 126c. The scatter elements 126a may be formed in various shapes including an island shape (as shown in FIG. 3b), a stripe shape (as shown in FIG. 3c), a mesh shape (as shown in FIG. 3d), and the like. The scatter elements 126a, e.g., air gaps, may prevent light generated in the active layer 127 from being trapped in the nitride semiconductor layers by scattering the light, thereby improving light extraction efficiency. Furthermore, the scatter elements 126a may act as insulation patterns to prevent current from concentratedly flowing in a vertical direction, thereby spreading the current in a horizontal direction and increasing current spreading. A portion of the upper nitride semiconductor layer 126c positioned over the scatter elements 126a and a portion of the lower nitride semiconductor layer 126b positioned under the scatter elements 126a are electrically connected to each other through a region free of the scatter elements 126a, thereby providing a current path.

Referring back to FIG. 3a, the scatter elements 126a, e.g., the air gaps, are positioned to be spaced apart from the active layer 127 at a predetermined distance D. For example, the distance D may be in the range of 100 nm to 1000 nm. If the distance D is less than 100 nm, the thickness of the re-grown upper nitride semiconductor layer 126c may be too thin, and therefore, it may be difficult to grow a high-quality active layer 127. If the distance D is 1000 nm or greater, the effect of improving light extraction efficiency by scattering light using the scatter elements 126a may be decreased.

Meanwhile, each of the width W and height H of the scatter elements 126a may be within a range of 50 nm to 1000 nm. That is, the dimension of the scatter elements 126a has a nano-scale size at which light generated in the active layer 127 can be scattered. If the dimension of the scatter elements 126a is less than 50 nm or more than 1000 nm, it may be difficult for light to be scattered.

The interval L between the scatter elements 126a may be within a range of 100 nm to 1000 nm. If the interval L is less than 100 nm, forward voltage may be excessively increased due to the increase in resistance by the scatter elements 126a. If the interval L exceeds 1000 nm, the light scattering effect by the scatter elements 126a may be decreased.

Meanwhile, the DBR 145 is positioned on a bottom surface of the substrate 121. The DBR 145 has a multi-layered structure in which layers having different refractive indices from each other are alternately stacked. For example, the DBR may be formed by alternately stacking first layers made of $SiO_2$ and second layers made of $TiO_2$ or $Nb_2O_5$. The thickness of the first layers and the second layers may be selected so that high reflectance is exhibited for the wavelength of light generated in the active layer 127, but it is unnecessary that all the first layers or second layers have the same thickness.

Furthermore, a plurality of DBRs 140 and 150 may be stacked to have a relatively high reflectance, e.g., a reflectance of 90% or higher throughout not only a wavelength region of light generated in the active layer 127 but also a wide wavelength region of visible light. The plurality of DBRs is stacked, so that high reflectance may be exhibited for a wide wavelength region in the visible light spectrum. For example, in case of an LED package that emits white light by mounting an LED according to exemplary embodiments of the present invention, light of a different wavelength from that of light generated in the active layer 127 may be incident onto the LED. In this case, the light of the different wavelength can be reflected, thereby improving the light extraction efficiency of the LED package.

Figure 4:
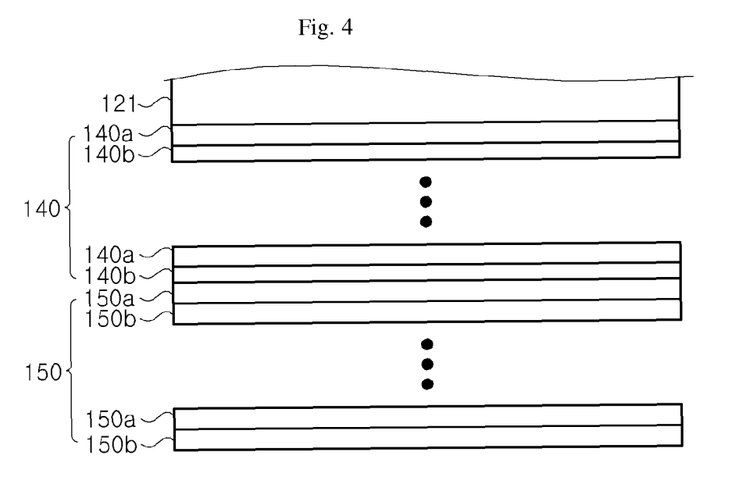
FIG. 4 is an enlarged partial sectional view illustrating a DBR of the LED according to the exemplary embodiment of the present invention.
Figure 5:
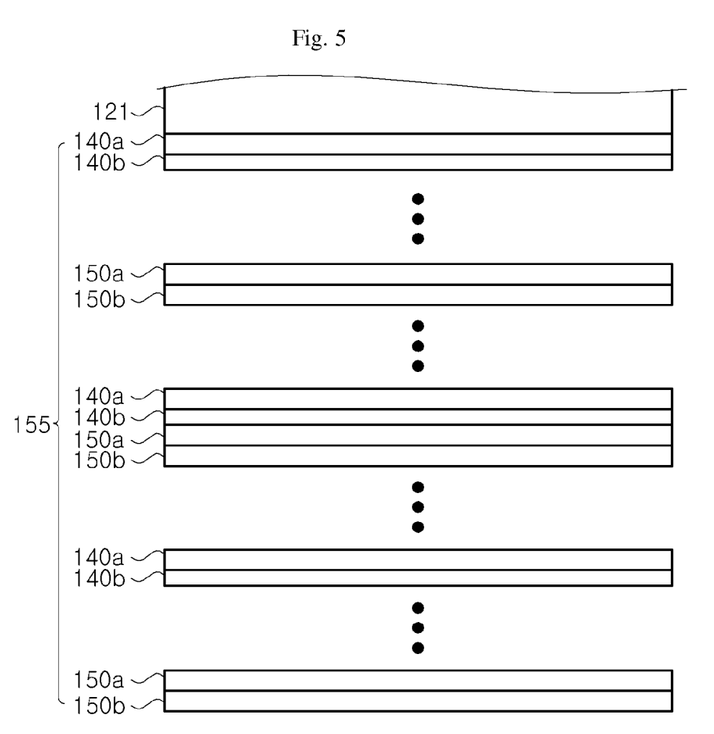
FIG. 5 is a partial sectional view illustrating a DBR of an LED according to an exemplary embodiment of the present invention.

FIG. 4 and FIG. 5 are enlarged partial sectional views illustrating DBRs having high reflectance throughout a wide wavelength region of the visible light spectrum.

Referring to FIG. 4, the DBR 145 is positioned under the substrate 121. The DBR 145 comprises a first DBR 140 and a second DBR 150.

The first DBR 140 is formed with a plurality of pairs of first material layers 140a and second material layers 140b, and the second DBR 150 is formed with a plurality of pairs of third material layers 150a and fourth material layers 150b. The plurality of pairs of first material layers 140a and second material layers 140b may have relatively high reflectance for light in a green or red wavelength region, e.g., light of 550 nm or 630 nm, as compared with light in a blue wavelength region, and the second DBR 150 may have a relatively high reflectance for light in a blue wavelength region, e.g., light of 460 nm, as compared with light in a red or green wavelength region. In the present exemplary embodiment, the optical thickness of the first material layers 140a and the second material layers 140b in the first DBR 140 is thicker than that of the third material layers 150a and the fourth material layers 150b in the second DBR 150. However, the present invention is not limited thereto, but the material layers in the second DBR 150 may have the optical thickness thicker than the material layers in the first DBR 140.

The first material layer 140a may have the same material as the third material layer 150a, therefore having the same refractive index, and the second material layer 140b may have the same material as the fourth material layer 150b, therefore having the same refractive index. For example, the first material layer 140a and the third material layers 150a may be formed of $TiO_2$ (refractive index n: about 2.5), and the second material layers 140b and the fourth material layers 150b may be formed of $SiO_2$ (refractive index n: about 1.5).

Meanwhile, in the present exemplary embodiment the optical thickness (refractive index×actual thickness) of the first material layer 140a is substantially an integer multiplied by the optical thickness of the second material layer 140b, and their actual thicknesses may be substantially identical to each other. The optical thickness of the third material layer 150a is substantially an integer multiplied by the optical thickness of the fourth material layer 150b, and their actual thicknesses may be substantially identical to each other.

In addition, the optical thickness of the first material layer 140a is greater than that of the third material layer 150a, and the optical thickness of the second material layer 140b is greater than that of the fourth material layer 150b. The optical thicknesses of the first to fourth material layers 140a, 140b, 150a and 150b may be controlled by adjusting the refractive index and/or actual thickness of each of the material layers.

Referring back to FIG. 2, the reflection metal layer 151, which may be made of, for example, Al, Ag, or Rh may be formed under the DBR 145, and the protection layer 153 for protecting the DBR 145 may be formed. For example, the protection layer 153 may be formed of Ti, Cr, Ni, Pt, Ta and Au, alloys thereof, or any combination of these metals and alloys. The protection layer 153 protects the DBR 145 from external impact or contamination.

According to the present exemplary embodiment, the DBR 145 has a structure in which the first DBR 140 having a relatively higher reflectance for visible light of a long wavelength and the second DBR 150 having a relatively higher reflectance for visible light of a short wavelength are stacked with each other. The DBR 145 can increase the reflectance for light throughout most of the visible light region by the combination of the first DBR 140 and the second DBR 150.

Generally, DBRs have high reflectance for light in a specific wavelength range but low reflectance for light in the other wavelength ranges. Hence, there is a limitation in improving the light extraction efficiency of an LED package that emits white light. However, according to the present exemplary embodiment, since the DBR 145 may have high reflectance not only for light in a blue wavelength region but also for light in green and red wavelength regions, the luminous efficiency of the LED package may be improved.

In the present exemplary embodiment, the two reflectors, i.e., the first DBR 140 and the second DBR 150 have been described, but a larger number of reflectors may be used. When a larger number of reflectors are used, reflectors having relatively high reflectance for light of a long wavelength are preferably positioned relatively close to a light emitting structure.

In the present exemplary embodiment, the thicknesses of the first material layers 140a in the first DBR 140 may be different from one another, and the thicknesses of the second material layers 140b in the first DBR 140 may be different from one another. The thicknesses of the third material layers 150a in the second DBR 150 may be different from one another, and the fourth material layers 150b in the second DBR 150 may be different from one another. The thickness of each material layer may be selected to have a reflectance of at least 90%, throughout the whole wavelength region of the visible light spectrum.

Although it has been described in the present exemplary embodiment that the material layers 140a, 140b, 150a and 150b are formed of $SiO_2$ or $TiO_2$, they are not limited thereto but may be formed, for example, of $Si_3N_4$, $Nb_2O_5$, compound semiconductor or the like. Preferably, the difference between the refractive indices of the first material layers 140a and the second material layers 140b is greater than 0.5, and the difference between the refractive indices of the third material layers 150a and the fourth material layers 150b is greater than 0.5.

Furthermore, the first and last layers of the DBR 145 may be formed of $SiO_2$. $SiO_2$ layers may be disposed as the first and last layers of the DBR 145, so that it is possible to stably attach the first DBR 140 to the substrate 121 and to protect the second DBR 150.

FIG. 5 is a sectional view illustrating a DBR 155 according to another exemplary embodiment of the present invention. FIG. 4 shows and illustrates that the DBR 145 has a stack of the first DBRs 140 and second DBRs 150. In the DBR 155 according to the present exemplary embodiment, a plurality of pairs of first material layers 140a and second material layers 140b and a plurality pairs of third material layers 150a and fourth material layers 150b are mixed with each other. That is, at least one pair of the third material layers 150a and fourth material layers 150b is positioned between the plurality of pairs of first material layers 140a and second material layers 140b, and at least one pair of the first material layers 140a and second material layers 140b is also positioned between the plurality of pairs of third material layers 150a and fourth material layers 150b. Here, the optical thicknesses of the first to fourth material layers 140a, 140b, 150a and 150b are controlled to have high reflectance for light throughout a wide range of the visible light spectrum.

Although some examples of the DBR having high reflectance throughout a wide wavelength region of the visible light spectrum have been described above, DBRs with various structures may be formed by repeatedly stacking layers having different refractive indices. The optical thicknesses of these layers may be controlled, thereby forming a DBR having high reflectance throughout the entire wavelength region in the visible light spectrum.

Figure 6:
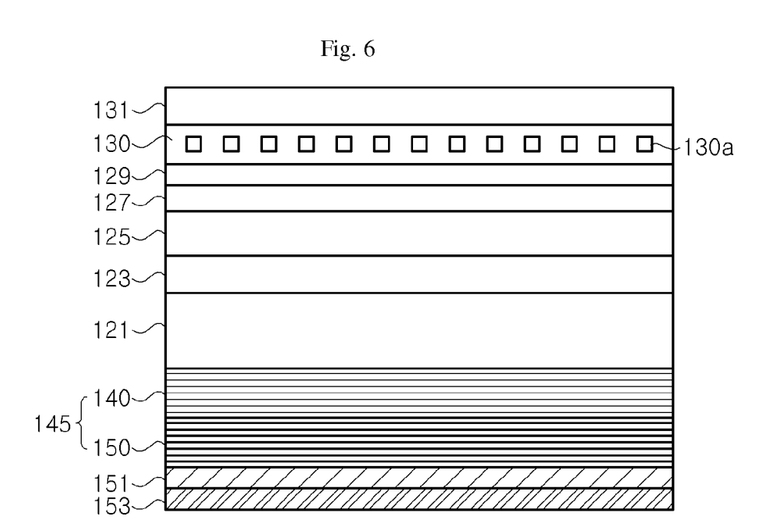
FIG. 6 is a sectional view illustrating an LED according to an exemplary embodiment of the present invention.

FIG. 6 is a sectional view illustrating an LED according to another exemplary embodiment of the present invention.

Referring to FIG. 6, the LED according to the present exemplary embodiment is generally similar to the LED described with reference to FIG. 2. However, the LED according to the present exemplary embodiment is different from the LED of FIG. 2 in that a third nitride semiconductor layer 130 having scatter elements 130a, e.g., air gaps, formed therein, is positioned between the second nitride semiconductor layer 131 and the active layer 127.

That is, the third nitride semiconductor layer 130 is positioned on the clad layer 129, which is respectively positioned on the active layer 127, and the second nitride semiconductor layer 131 is positioned on the third nitride semiconductor layer 130. The scatter elements 130a improve light extraction efficiency by scattering light generated in the active layer 127, and help current spreading by increasing the resistance of the third nitride semiconductor layer 130, similar to the scatter elements 126a.

Figure 7:
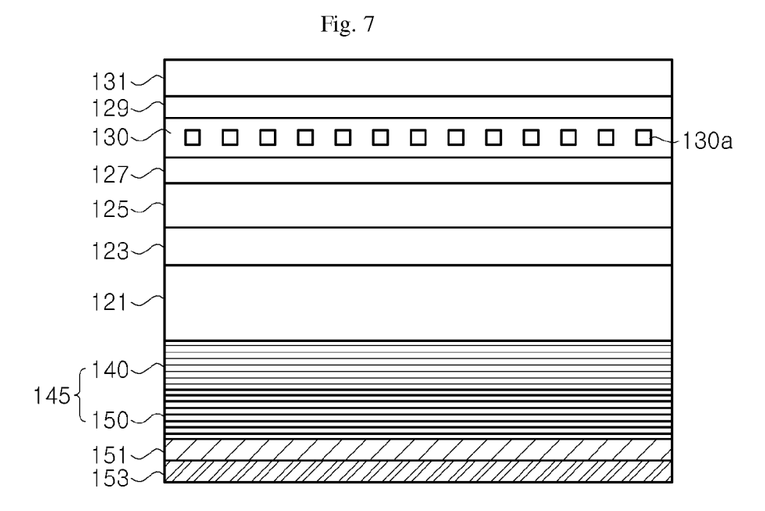
FIG. 7 is a sectional view illustrating an LED according to an exemplary embodiment of the present invention.

FIG. 7 is a sectional view illustrating an LED according to another exemplary embodiment of the present invention.

Referring to FIG. 7, the LED according to the present exemplary embodiment is generally similar to the LED described with reference to FIG. 6. However, the LED according to the present exemplary embodiment is different from the LED of FIG. 6 in that the third nitride semiconductor layer 130 having the scatter elements 130a, e.g., the air gaps, formed therein, is positioned between the clad layer 129 and the active layer 127. According to the present exemplary embodiment, the scatter elements 130a may be positioned closer to the active layer 127 than in the exemplary embodiment discussed with reference to FIG. 6.

In the exemplary embodiments of FIG. 6 and FIG. 7, since the scatter elements 130a are formed in the third nitride semiconductor layer 130 after the active layer 127 is grown, they may be positioned closer to the active layer 127 as compared with a case where the third nitride semiconductor layer 126 is positioned between the first nitride semiconductor layer 125 and the active layer 127. For example, the scatter elements 130a may be positioned within a range of 50 nm to 1000 nm from the active layer 127.

In the previous exemplary embodiments, the LED in which the scatter elements 130a are positioned below or above the active layer 127 has been described. However, the scatter elements 130a may be positioned at both sides of the active layer 127.

In the aforementioned descriptions, the ranges of the width W and height H of the air gaps and the ranges of the interval L and spacing distance D between the air gaps have been described. However, the ranges of these dimensions may be identically applied to insulation patterns formed of silicon nitride or silicon oxide in addition to the air gaps.

Figure 8:
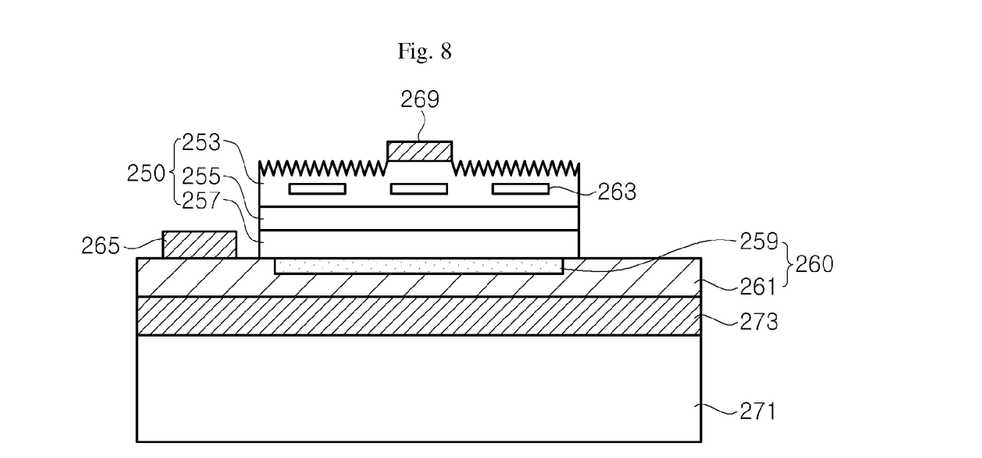
FIG. 8 is a sectional view illustrating an LED according to an exemplary embodiment of the present invention.
Figure 9:
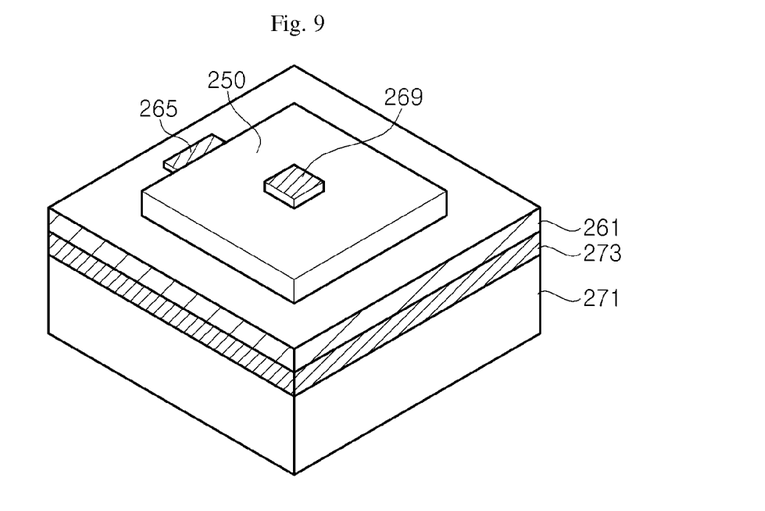
FIG. 9 is a perspective view illustrating an LED according to an exemplary embodiment of the present invention.

FIG. 8 and FIG. 9 are sectional and perspective views illustrating LEDs according to exemplary embodiments of the present invention, respectively.

Referring to FIG. 8 and FIG. 9, the LED includes a support substrate 271, a bonding metal 273, a semiconductor stack 250, a p-electrode 260, an n-electrode 269, and a p-bonding pad 265.

The support substrate 271 is distinguished from a growth substrate for growing compound semiconductor layers, and is a secondary substrate that is attached to the previously grown compound semiconductor layers. It is unnecessary that the support substrate be conductive, and the support substrate may be, for example, a sapphire substrate. Although the support substrate 271 may be a sapphire substrate, it is not limited thereto and the support substrate may be another kind of an insulative or conductive substrate. Particularly, in a case where a sapphire substrate is used as the support substrate 271, the support substrate 271 may have a thermal expansion coefficient identical to that of the sapphire growth substrate. Hence, wafer warpage may be prevented when bonding the support substrate and removing the grown substrate. Further, a rigid substrate may used as the support substrate, so that it is possible to prevent the LED from being deformed, and so the semiconductor stack 250 may be supported by the support substrate 271.

The semiconductor stack 250 is positioned above the support substrate 271, and comprises a p-type compound semiconductor layer 257, an active layer 255 and an n-type compound semiconductor layer 253. In the semiconductor stack 250, the p-type compound semiconductor layer 257 is positioned closer to the support substrate 271 than the n-type compound semiconductor layer 253, to form a vertical-type LED. The semiconductor stack 250 is positioned in a partial region of the support substrate 271. That is, the support substrate 271 has an area relatively wider than the semiconductor stack 250, and the semiconductor stack 250 is positioned in the region surrounded by an edge of the support substrate 271.

The n-type compound semiconductor layer 253, the active layer 255 and the p-type compound semiconductor layer 257 may be formed of a III-N-based compound semiconductor, e.g., an (Al, Ga, In)N semiconductor. Each of the n-type and p-type compound semiconductor layers 253 and 257 may have a single- or multi-layered structure. For example, the n-type compound semiconductor layer 253 and/or the p-type compound semiconductor layer 257 may comprise a contact layer and a clad layer, and may also comprise a superlattice layer. In addition, the active layer 255 may have a single or multiple quantum well structure. The n-type compound semiconductor layer 253 with relatively low resistance is positioned opposite to the support substrate 271, so that a roughened surface may be formed on the upper surface of the n-type compound semiconductor layer 253. The roughened surface improves the extraction efficiency of light generated in the active layer 255.

The n-type compound semiconductor layer 253 may have a roughened surface thereon. That is, the surface of the n-type compound semiconductor layer 253 is roughened using a dry or photo enhanced chemical (PEC) etching technique, thereby improving the light extraction efficiency.

Meanwhile, the n-type compound semiconductor layer 253 may have a plurality of scatter elements 263 formed to be spaced apart from one another in the inside of the n-type compound semiconductor layer 253. The scatter elements 263 may include the same features as the scatter elements 126a and 130a described with reference to exemplary embodiments shown in FIG. 2, FIG. 3a, FIG. 6, and FIG. 7.

The scatter elements 263 increase a critical angle for internal total reflection by scattering light generated in the active layer 255. The internal total reflection critical angle is increased twice by scattering light through the scatter elements 263 and then also scattering light through the roughened surface formed on the surface of the n-type compound semiconductor layer 253, so that the light extraction efficiency can be further improved.

The scatter elements 263 may have various shapes, such as a matrix of islands, a plurality of lines, and a net-shape.

The scattering of light by the scatter elements 263 results from a difference between the refractive indices of the scatter elements 263 and the n-type compound semiconductor layer 253. Therefore, the scatter elements 263 may be formed using a material having a different refractive index from the n-type compound semiconductor layer 253. For example, the scatter elements 263 may be an oxide or air layer. The scatter elements 263 may be a DBR.

The scatter elements 263 may be formed by alternately stacking two or more insulation layers having different refractive indices from each other. For example, $SiO_2$ and $Si_3N_4$ layers may be alternately stacked.

The scatter elements 263 may be formed by partially growing the n-type compound semiconductor layer 253, alternately stacking two or more insulation layers having different refractive indices as a plurality of layers and then patterning and etching the stacked insulation layers using a photolithography technique. The insulation layers of the scatter elements 263 are alternately stacked as a form of a reflection layer. For example, the insulation layers may be stacked as a plurality of layers by alternating the $SiO_2$ and $Si_3N_4$ layers.

The scatter elements 263 are formed on the partially grown n-type compound semiconductor layer 253 as described above, and then, the rest of the n-type compound semiconductor layer 253 is formed.

As the scatter elements 263 are formed by alternately stacking two or more insulation layers having different refractive indices with each other as a plurality of layers, it may function as a DBR. Thus, light having various wavelengths generated in the active layer 255 may be reflected by the scatter elements 263, so that light scattering can effectively occur, as described above with reference to the previous exemplary embodiments.

The p-electrode 260 is positioned between the p-type compound semiconductor layer 251 and the support substrate 271, and is in ohmic contact with the p-type compound semiconductor layer 257. The p-electrode 260 may comprise a reflection layer 259 and a protection metal layer 261. The reflection layer 259 may be embedded in the protection metal layer 261, between the semiconductor stack 250 and the support substrate 271. The reflection layer 259 may be formed, for example, of a reflective metal such as Ag, and the protection metal layer 261 may be formed, for example, of Ni. The protection metal layer 261 may be positioned on an entire surface of the support substrate 271. Thus, the protection metal layer 261 has a region exposed to the outside of the semiconductor stack 250.

A p-type bonding pad 265 may be positioned on the exposed portion of the protection layer 261. The p-type bonding pad 265 is electrically connected to the p-type compound semiconductor layer 257 through the p-electrode 260.

Meanwhile, the bonding metal 273 is positioned between the support substrate 271 and the p-electrode 260 to bond the semiconductor stack 250 and the support substrate 271. The bonding metal 273 may be formed, for example, of Au—Sn using eutectic bonding or the like.

The p-electrode 260 is flip-bonded to the support substrate 271 by the bonding metal 273, and the n-type compound semiconductor layer 253 is exposed by removing the growth substrate.

Meanwhile, the n-electrode 269 is positioned on the semiconductor stack 250, and is electrically connected to the n-type compound semiconductor layer 253.

A surface of the exposed n-type compound semiconductor layer 253 is roughened using a dry or PEC etching technique, to thereby improve the light extraction efficiency.

In the exemplary embodiments described above, it has been described that the p-type compound semiconductor layer 257 is positioned closer to the support substrate 271 than the n-type compound semiconductor layer 253. However, the present invention is not limited thereto and they may also be arranged reversely. In that case, the polarities of the n-electrode 269 and the p-electrode 260 and p-type bonding pad 265 are reversed to each other.

According to the exemplary embodiments of the present invention, light extraction efficiency may be improved by employing the insulation patterns capable of scattering light generated in the active layer. Also, the light scattering characteristics can be improved by forming the insulation patterns as air gaps with low refractive index. Also, current may be uniformly spreaded in a horizontal direction due to the insulation patterns, so that it is possible to improve luminous efficiency and static discharge characteristics. Further, the DBR with the multi-layered structure is positioned on the bottom surface of the substrate, so that light proceeding downward from the substrate through the substrate may be reflected, thereby improving light extraction efficiency. Furthermore, an LED suitable for a white LED package may be provided by employing the DBR having high reflectance throughout the entire wavelength region of the visible light spectrum. Also, light loss caused by internal total reflection may be reduced by employing the scattering patterns together with the roughened surface, so that the light extraction efficiency may be maximized.

Although the exemplary embodiments of the present invention are described for illustrative purposes, it will be apparent to those skilled in the art that various modifications and changes can be made thereto within the scope of the invention without departing from the essential features of the invention. Accordingly, the aforementioned exemplary embodiments should be construed not to limit the technical spirit of the present invention but to be provided for illustrative purposes so that those skilled in the art can fully understand the spirit of the present invention.

What is claimed is:

1. A light emitting diode (LED), comprising:
   a substrate;
   a first nitride semiconductor layer arranged on the substrate;
   an active layer arranged on the first nitride semiconductor layer;
   a second nitride semiconductor layer arranged on the active layer;
   a third nitride semiconductor layer disposed between the first nitride semiconductor layer and the active layer or between the second nitride semiconductor layer and the active layer, the third nitride semiconductor layer comprising a plurality of scatter elements within the third nitride semiconductor layer; and
   a distributed Bragg reflector (DBR) comprising a multi-layered structure, the substrate being arranged between the DBR and the third nitride semiconductor layer,
   wherein:
   the scatter elements comprise air gaps surrounded on four sides by the third nitride semiconductor layer; and
   the air gaps are disposed in a range of 100 nm to 1000 nm from the active layer.

2. The LED of claim 1, wherein the interval between the air gaps is in a range of 100 nm to 1000 nm.

3. The LED of claim 1, wherein each of a width and a height of the air gaps is in a range of 50 nm to 1000 nm.

4. The LED of claim 1, wherein the third nitride semiconductor layer is arranged between the first nitride semiconductor layer and the active layer, and the air gaps are arranged in a range of 100 nm to 1000 nm from the active layer.

5. The LED of claim 1, wherein the third nitride semiconductor layer is arranged between the second nitride semiconductor layer and the active layer, and the air gaps are arranged in a range of 50 nm to 500 nm from the active layer.

6. The LED of claim 5, further comprising a clad layer disposed between the air gaps and the active layer.

7. The LED of claim 1, wherein the DBR comprises a reflectance of at least 90% for light of a first wavelength in a blue wavelength region, light of a second wavelength in a green wavelength region, and light of a third wavelength in a red wavelength region.

8. The LED of claim 7, further comprising a reflective metal layer, the DBR being arranged between the substrate and the reflective metal layer.

9. The LED of claim 1, wherein the scatter elements comprise silicon oxide or silicon nitride.

10. The LED of claim 1, wherein the scatter elements comprise a matrix of islands shape, a plurality of lines, or a net-shape.

11. A light emitting diode (LED), comprising:
    a semiconductor stack arranged on a support substrate, the semiconductor stack comprising:
    a first conductivity-type semiconductor layer;
    an active layer; and
    a second conductivity-type semiconductor layer;
    a first electrode arranged between the support substrate and the semiconductor stack, the first electrode being in ohmic contact with the semiconductor stack, the first electrode comprising a first region exposed to the outside of the semiconductor stack;
    a first bonding pad arranged on the first region of the first electrode, the first bonding pad electrically connected to the first electrode; and
    a second electrode arranged on the semiconductor stack,
    wherein at least one of the first conductivity-type semiconductor layer and the second conductivity-type semiconductor layer comprises a plurality of scatter elements spaced apart from one another,
    wherein the scatter elements are entirely enclosed in the first conductivity-type semiconductor layer or the second conductivity-type semiconductor layer, and
    wherein the scatter elements comprise an air layer and are arranged in a range of 50 nm to 1000 nm from the active layer.

12. The LED of claim 11, wherein the first electrode comprises a reflective layer and a protection layer, wherein the reflective layer is disposed between the semiconductor stack and the protection layer.

13. The LED of claim 12, wherein the reflective layer is completely covered by the semiconductor stack and the protection layer.

14. The LED of claim 11, wherein a width and a height of each of the scatter elements is in a range of 50 nm to 1000 nm.

15. The LED of claim 11, wherein the interval between the scatter elements is in a range of 100 nm to 1000 nm.

16. The LED of claim 11, wherein the scatter elements comprise a matrix of islands shape, a plurality of lines, or a net-shape.

17. A light emitting diode (LED), comprising:
    a substrate;
    a first nitride semiconductor layer arranged on the substrate;
    an active layer arranged on the first nitride semiconductor layer;
    a second nitride semiconductor layer arranged on the active layer;
    a third nitride semiconductor layer disposed between the first nitride semiconductor layer and the active layer or between the second nitride semiconductor layer and the active layer, the third nitride semiconductor layer comprising a plurality of scatter elements entirely enclosed within the third nitride semiconductor layer; and
    a distributed Bragg reflector (DBR) comprising a multi-layered structure, the substrate being arranged between the DBR and the third nitride semiconductor layer,
    wherein:
    the scatter elements comprise air gaps surrounded on four sides by the third nitride semiconductor layer; and
    the air gaps are disposed in a range of 100 nm to 1000 nm from the active layer.

* * * * *